US006826211B2

(12) United States Patent
Tatsuno et al.

(10) Patent No.: US 6,826,211 B2
(45) Date of Patent: Nov. 30, 2004

(54) DIODE LASER CONTROLING MODULE AND APPLIED EQUIPMENT THEREOF

(75) Inventors: Kimio Tatsuno, Tokyo (JP); Katsumi Kuroguchi, Yokohama (JP); Hiroaki Furuichi, Yokohama (JP); Atsuhiro Yamamoto, Yokohama (JP); Norio Nakazato, Kashiwa (JP)

(73) Assignees: Hitachi, Ltd., Tokyo (JP); Opnext Japan, Inc., Yokohama (JP)

( * ) Notice: Subject to any disclaimer, the term of this patent is extended or adjusted under 35 U.S.C. 154(b) by 309 days.

(21) Appl. No.: 09/955,948

(22) Filed: Sep. 20, 2001

(65) Prior Publication Data

US 2003/0002050 A1 Jan. 2, 2003

(30) Foreign Application Priority Data

Jun. 27, 2001 (JP) ........................................ 2001-194159

(51) Int. Cl.[7] .............................. H01S 3/13; H01S 3/04; H01S 3/00
(52) U.S. Cl. ........................ 372/34; 372/29.01; 372/36; 372/29.02; 372/38.01; 372/28
(58) Field of Search ................................ 372/20, 29.01, 372/29.011, 29.02, 33, 34, 36, 38.01, 38.02, 38.03, 43, 75, 28, 31

(56) References Cited

U.S. PATENT DOCUMENTS 5,825,792 A  * 10/1998 Villeneuve et al. ............ 372/32
6,477,190 B1 * 11/2002 Komiyama et al. ............ 372/34
2002/0163650 A1 * 11/2002 May ............................. 356/519

FOREIGN PATENT DOCUMENTS

JP          10-079723       7/1997

* cited by examiner

Primary Examiner—Minsun Oh Harvey
Assistant Examiner—Armando Rodriguez
(74) Attorney, Agent, or Firm—Reed Smith LLP; Stanley P. Fisher, Esq.; Juan Carlos A. Marquez, Esq.

(57) ABSTRACT

Conventionally, in the wavelength locking optical system, the wavelength as detected is deviated from a targeted range owing to the change of the peripheral temperature resulting from the temperature characteristics of the wavelength error detection device. To solve this prior issue, it is arranged such that a portion of the wavelength error detection device, through which portion light-beams passes, contacts a material of high heat conductivity.

21 Claims, 11 Drawing Sheets

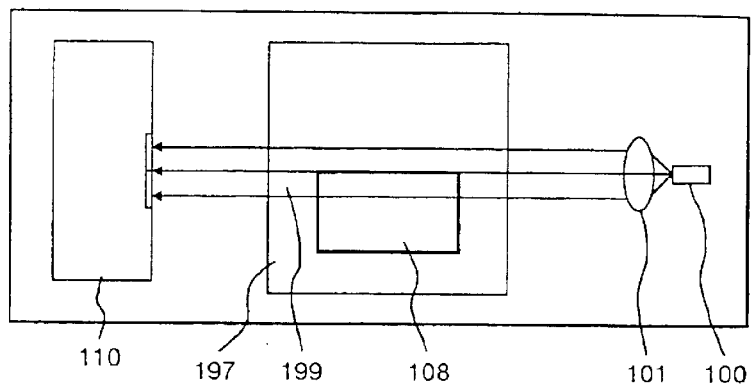
FIG. 11A
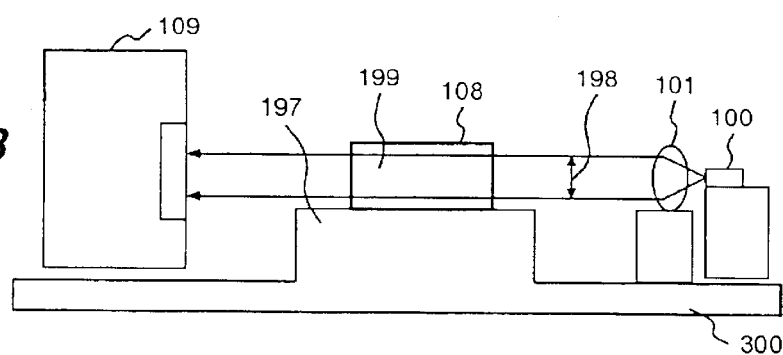
FIG. 11B
FIG. 12
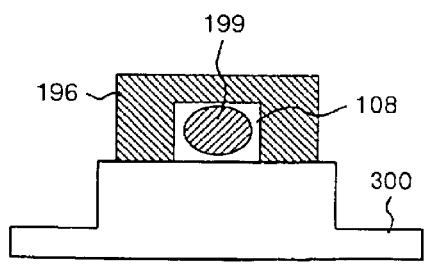

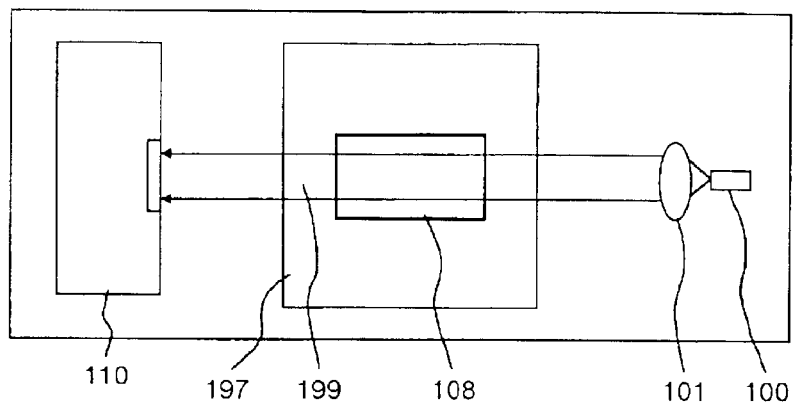
FIG. 13A
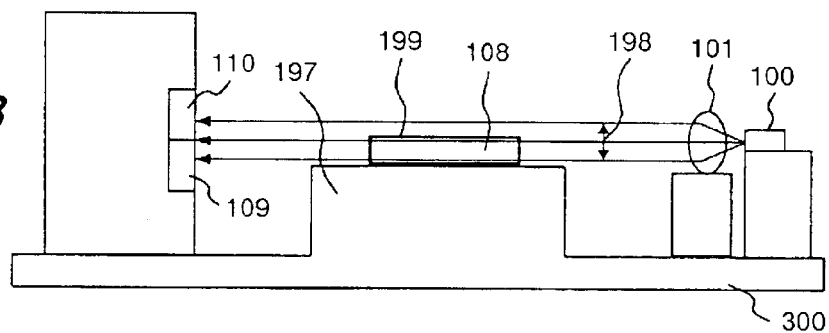
FIG. 13B
FIG. 14A
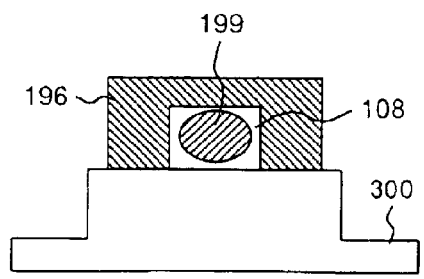
FIG. 14B
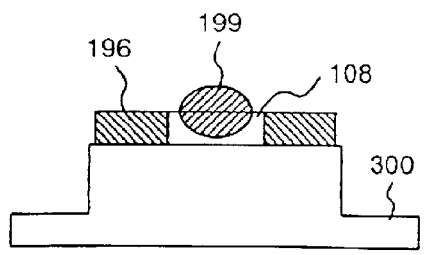

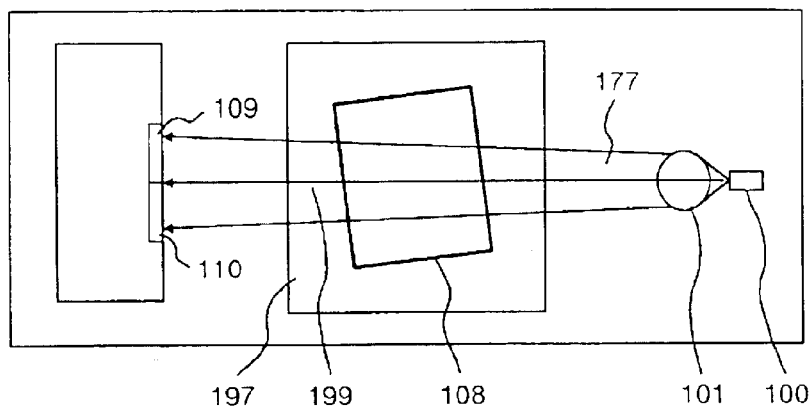
FIG. 15A
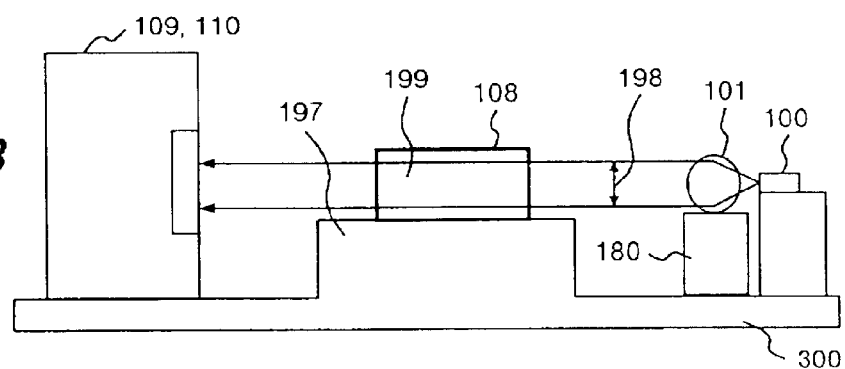
FIG. 15B
FIG. 16
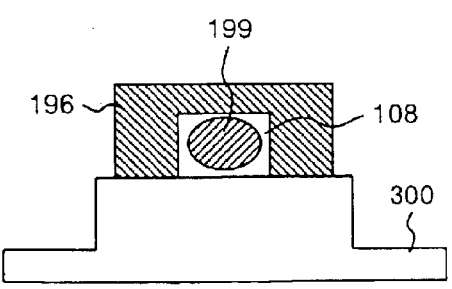

DIODE LASER CONTROLING MODULE AND APPLIED EQUIPMENT THEREOF

BACKGROUND OF THE INVENTION

1. Field of the Invention

The present invention relates to an optical communication module applied to the wavelength division multiplexing optical communication system, That is, pertaining to a device for locking an oscillating wavelength of a laser luminous source to a set point wherein an optical system to operate stably against the change of the ambient temperature and its control system are provided. This optical system can operate separately as a wavelength locking module, but it may be incorporated into an optical communication module provided with a laser luminous source.

2. Description of the Related Art

Optical fiber communication enables us to construct a highly credible communication system, as it is excellent in long distance, high-speed and large volume transmission as well as electromagnetic noise resistance. In this system, one wavelength of light is carried on each optical fiber, but further increase of transmission volume is solicited by the concerned according to the advent of the recent large volume transmission environment. Thus, in order to realize large volume transmission by carrying a number of lights having different wavelengths on each optical fiber so as to increase the number of communication channels, nowadays, the wavelength division multiplexing optical communication system is put into practice. For the wavelength of light to be transmitted through an optical fiber, the wavelength bands of less transmission loss of the fiber are used, the 1.3 and 1.5 micron areas of which wavelength bands are called windows of transmission. The wavelength width of the respective windows is limited to some extent, so that the narrower the wavelength interval between adjacent channels becomes, the more the number of transmission channels increases. At present, the frequency intervals are represented with 200 GHz and 100 GHz, which intervals tend to be narrower, e.g., 50 GHz, 25 GHz and further, which correspond to approximately 1.6 nm, 0.8 nm, 0.4 nm, 0.2 nm, 0.1 nm if represented by the wavelength intervals. When the wavelength intervals become narrow as described above, it requires that the wavelength of the laser luminous source be kept constant with precision. That is because the crosstalk with adjacent channels occurs on the part of the receiver when the wavelength of the laser luminous source unstably reaches that of adjacent channels, with the result that the credibility of the communication is not guaranteed. Those wavelength (or frequency) channels are called "ITU-T (International Telecommunication Union-Telecommunication Standardization Sector) grid", which is widely recognized as an International Telecommunication Union Standard.

In view of the foregoing, various methods for controlling the wavelength of the laser luminous source of the wavelength multiplexing optical communication have been proposed to date. As a wavelength selection device, for examples, a dielectric filter or a Fabry-Perot etalon is introduced so as to perform a feedback operation on the operating temperature of the semiconductor laser and to fix a wavelength. Especially, the Fabry-Perot etalon has the characteristics that transmission peaks repeatedly appear according to the degree of multiplex interferences, so that the accordance of the period of the transmission curve with the ITU grid enables the plurality of wavelength channels to be locked just with the sole selective filter element. For instance, according to the disclosure of Japanese Patent Application Laid-open No. HEI 10-79723, it is proposed that a wavelength is locked by separating the light transmitted through the etalon into two divisions, which divisions are received by a light detector so as to utilize the difference in wavelength between those divisions as a wavelength error signal.

However, the above Fabry-Perot etalon has the characteristic dependency on the ambient temperature. That is, it has the characteristics that the optical path length of the etalon changes and the wavelength of the transmitted light of the etalon varies owing to the change of its refractive index and coefficient of linear expansion when the ambient temperature of the etalon changes. In other words, it has been found that the change of the ambient temperature causes a gap between the wavelength point as desired through the utilization of the etalon and the actual wavelength to be locked. This gap arises from when carrying out a so-called tracking test or the ambient temperature of the package incorporating a wavelength locker therein changing from 0 to 70 centigrade. The present invention is to abate the temperature dependency of the etalon.

SUMMARY OF THE INVENTION

The means to solve the prior issue as described above according to the present invention is as follows. The etalon which corresponds to a wavelength error detecting device is installed on a substrate which is placed higher than the portion where the optical system of semiconductor laser convergence including a holder is installed and which contacts one end of a electronic cooler. Alternatively, the etalon is covered with a metallic material of high heat conductivity so that the temperature distribution within the etalon is of the minimum or minor range.

BRIEF DESCRIPTION OF THE DRAWINGS

FIG. 11A shows a plane view of the wavelength locking optical system according to the present invention.

FIG. 11B shows a cross sectional view of the wavelength locking optical system according to the present invention.

FIG. 12 shows an example of the wavelength locking optical system according to the present invention.

FIG. 13A shows a plane view of the wavelength locking optical system according to the present invention.

FIG. 13B shows a cross sectional view of the wavelength locking optical system according to the present invention.

FIG. 14A shows a cross sectional view of an example of the wavelength locking optical system according to the present invention.

FIG. 14B shows a cross sectional view of another example of the wavelength locking optical system according to the present invention.

FIG. 15A shows a plane view of an example of the wavelength locking optical system according to the present invention.

FIG. 15B shows a cross sectional view of an example of the wavelength locking optical system according to the present invention.

FIG. 16 shows an example of the wavelength locking optical system according to the present invention.

DETAILED DESCRIPTION OF THE PREFERRED EMBODIMENTS

Figure 1:
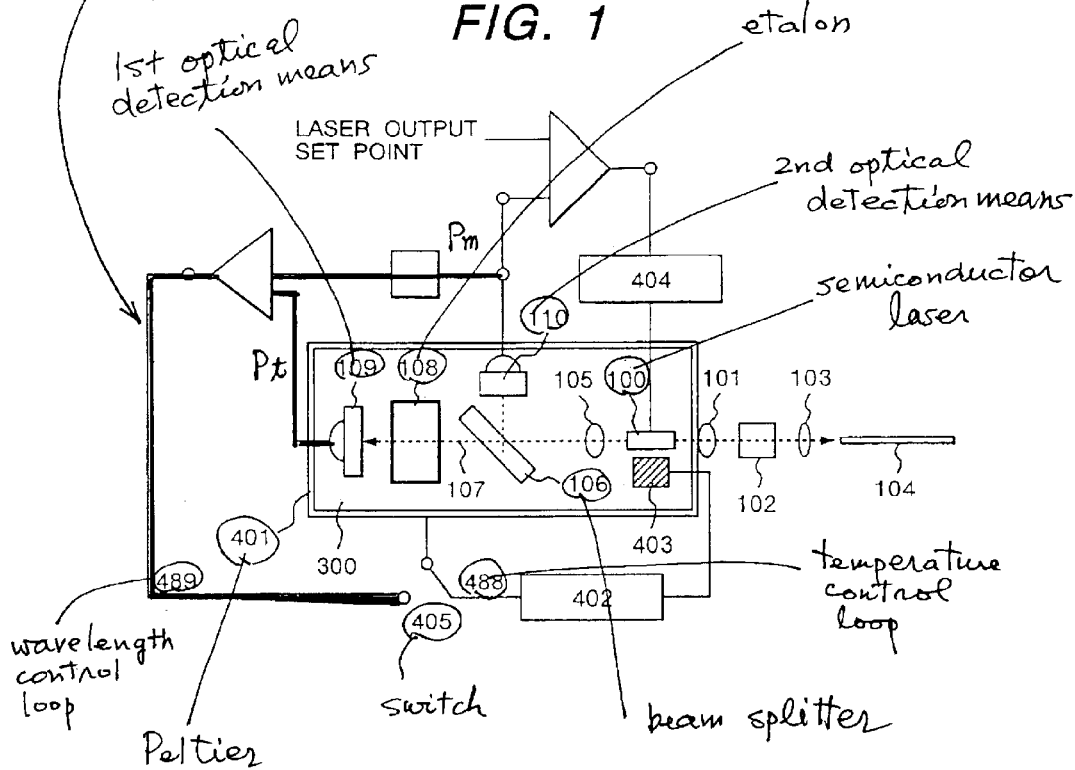
FIG. 1 is a systematic view of a wavelength control loop.
Figure 2:
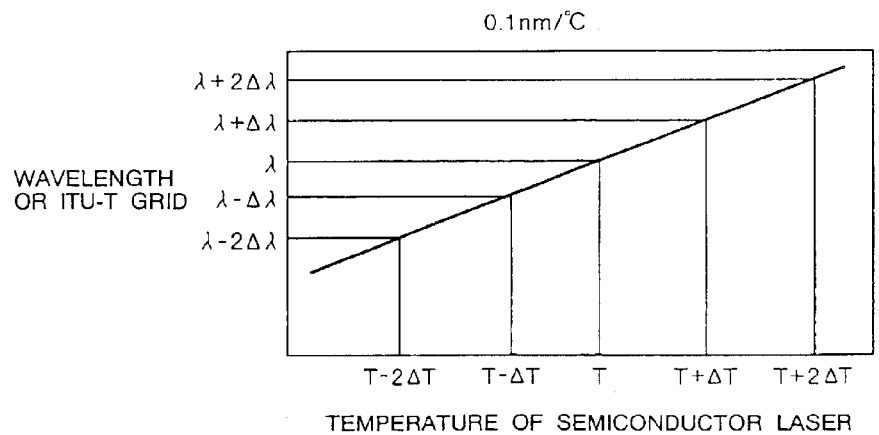
FIG. 2 is a correlation between the oscillating wavelength of the semiconductor laser and the temperature thereof.

FIG. 1 is an explanatory view to show a control loop which is a basis for locking a wavelength according to the present invention. That is, a wavelength variable laser luminous source 100 is a semiconductor laser of DFB (Distributed Feedback) or Fabry-Perot type, for instances. Alternatively, such luminous source as integrating a modulator of electric absorption type into a semiconductor laser of the DFB type is also adoptable. The oscillating wavelength of the wavelength variable laser luminous source 100 as mentioned above changes according to the change of the operating temperature of the laser as shown in FIG. 2, so that a wavelength corresponding to the ITU-T grid is selectable according to the operating temperature of the laser. That is, a wavelength variable laser luminous source 100, a condenser 105, a beam splitter 106, a light detector 110, an etalon 108, a light detector 109 and a thermistor 403 and so on are carried on a electronic cooler 401 provided below a stem 300 as described below and shown in FIG. 6 wherein the driving circuit 402 of the refrigeration device 401 keeps the temperature of the laser luminous source 100 at a temperature corresponding to the resistance of thermistor 403. In turn, the light emitted forwards from the wavelength variable laser luminous source 100 is collimated by a collimator 101 and is connected to an optical fiber 104 via an optical isolator 102, a focusing lens 103 so as to be transmitted.

The wavelength control loop embodied in the present invention is closed by switching a temperature control loop 488 which has been closed by a switch 405 with a wavelength control loop 489. First, the light emitted backwards from the wavelength variable laser luminous source 100 is collimated by a collimator 105 and is divided into a transmitted light 107 and a reflected light at a beam splitter 106. The beam splitter 106 has such shape as sticking triangle prisms together or coating a thin parallel plane plate with a dielectric film when adhesives are undesirable. The reflected light is converted into photoelectricity at a light detector 110 to monitor the laser luminous source 100 and the obtained data is compared with an output set point so as to keep the output of the laser luminous source constant.

Then, the optical system for detecting a wavelength error according to the present invention is as follows. That is, the transmitted light 107 farther reaches an etalon 108, in which the multiply reflected lights interfere with one another, and a transmission peak is obtained, which peak is represented by the following formula (1).

$$It=1/(1+F \sin^2(\phi)) \quad (1)$$

in which, $$F=4R/(1-R)^2 \quad (2)$$

$$\phi=(2\pi nt/\lambda) \cos \theta' \quad (3)$$

Figure 3:
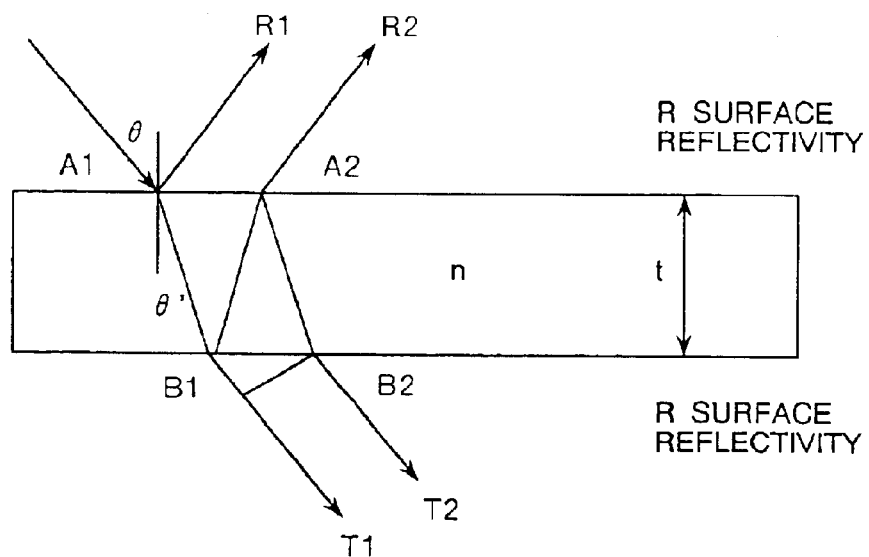
FIG. 3 is the operational explanatory view of the etalon embodied in the present invention.

As shown in FIG. 3, R signifies the coating reflection factor of each surface of the etalon 108, and n and t signify the refractive factor and the thickness thereof, respectively while λ and θ' signify the wavelength of light and an angle that a light beam makes inside the etalon, respectively.

The following Snell's law is applicable herein.

$$\sin \theta = n \sin \theta' \quad (4)$$

Further, the interval between the repeated peaks of the transmitted light is called FSR (Free Spectral Range), which FSR is represented with the following formulae in the wavelength band and in the frequency band, respectively, $$FSR=\lambda^2/2nt \quad (5)$$

$$FSR=c/2nt, \quad (6)$$

in which c is light speed.

Accordingly, the thickness t, the refractive factor n and the coating reflection factor R of the etalon are arranged such that FSR corresponds to the interval of ITU-T grids. The accordance of the ITU-T grids with FSR enables wavelength error detection with sharp selectivity as desired over the wide range of wavelength to be realized. This provides the plurality of light transmitting areas having a wavelength as desired with a given wavelength interval, any one of which areas corresponds to the oscillating wavelength as required by the laser luminous source.

Figure 4:
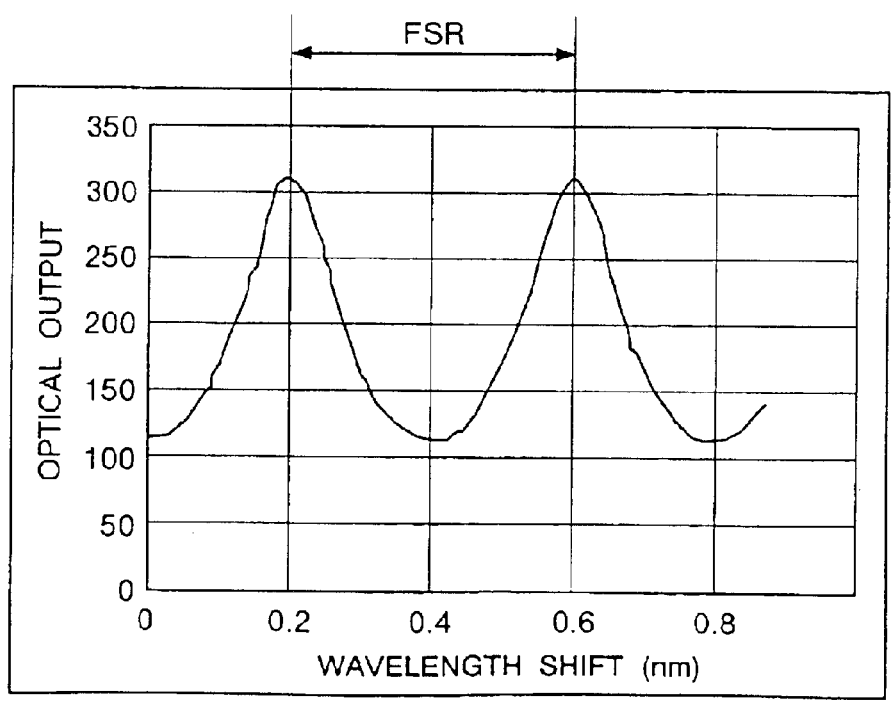
FIG. 4 is the wavelength spectral characteristics of the etalon.

The transmission peaks, as shown in FIG. 4, repeatedly appear according to the change of the wavelength, which peak to peak interval is called the FSR as mentioned above and represented by the above formulae (5) and (6). The light to be transmitted through the etalon is received by the light detector 109 as shown in FIG. 1 so as to be converted into photoelectric current. On the other hand, the light to be reflected at the beam splitter 106 is received at the light detector 110 so as to be converted into photoelectric current. As for the wavelength error detection signal, the difference between the photoelectric current Pm flowing through the light detector 110 for monitoring light output and the photoelectric current Pt flowing through the light detector 109 according to the above formula (1) for monitoring wavelength, which detector is disposed behind the etalon 108, is defined as an error signal A (λ).

$$A(\lambda)=Pt-Pm \quad (7)$$

As for the error signal, it is proper to use the following signal normalized by quantity of light.

$$A(\lambda)=(Pt-Pm)/(Pt+Pm) \quad (8)$$

Feed back operation is performed on a driving circuit 402 of a temperature control device 401 of the semiconductor laser 100 as shown in FIG. 1 so that the wavelength error signal value A(1) with high sensitivity as obtained becomes zero or constant. In order that the error signal as represented by the formulae (7) or (8) catches the vicinity of one of ITU grid wavelengths as required, it is necessary to read the temperature of the semiconductor laser from the value of thermistor 403 beforehand and to define the operating temperature of the laser at that vicinity on the basis of the relation between the temperature and the wavelength as shown in FIG. 2. Thereafter, a switch 405 is changed over to a wavelength locking loop. On the other hand, the APC (Automatic Power Control) compares the output of the light detector 110 with the set point and feed back the data as obtained to the driving current control circuit 404 of the semiconductor laser 100. That is all for the explanation of the wavelength locking loop.

The ratio of a value $\epsilon$ equivalent to the half width of the transmission peak of the etalon to FSR is called finesse $\Phi$, the following relation between the finesse and the reflection factor R of the etalon exists.

$$F=4R/(1-R)^2 \tag{9}$$

$$\Phi=(\pi\sqrt{F})/2 \tag{10}$$

$$\Phi=FSR/\epsilon \tag{11}$$

Accordingly, in order to obtain the sharp spectral characteristics of the etalon, that is, to obtain a small value $\epsilon$, it is required to enhance the reflection factor of both sides of the etalon and to occur a number of reflections on both sides of the etalon. To that end, the angle of incidence with regard to the etalon is required to be substantially vertical.

Figure 5:
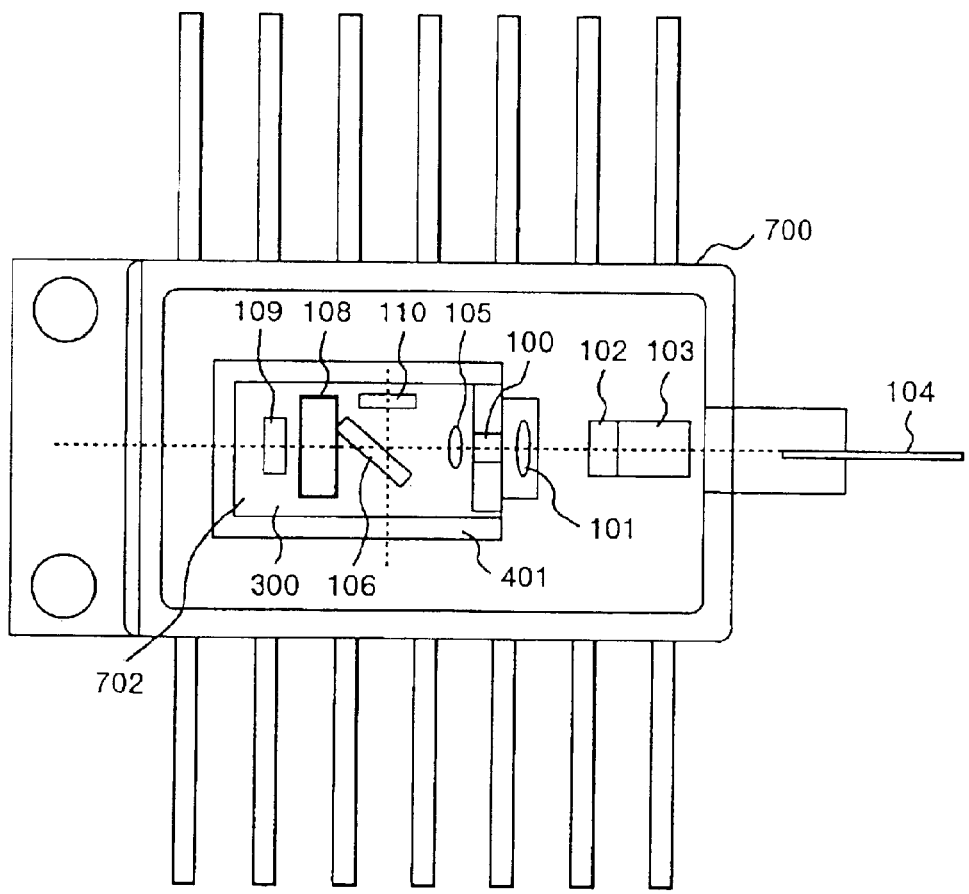
FIG. 5 shows an optical communication module incorporating a wavelength locking portion therein.

That is all for the principle of the wavelength error detection by means of the etalon, on the basis of which principle the optical communication module as shown in FIG. 5 is constructed. That is, the light beam emitted forwards from the semiconductor laser luminous source 100 is converged in the collimator and connected to the fiber 104 via the optical isolator 102 and the focusing lens 103. On the other hand, the light beam emitted backwards from the laser source is converged in the condenser 105 and is separated into two divisions by the beam splitter 106, one of which division monitors the output level of the light beam at the light detector 110 while the other division thereof reaches the light detector 109 via the etalon 108 so as to obtain the wavelength error detection curve as shown in FIG. 4. Those optical devices are carried on a stem substrate 300, which substrate is carried on an electronic refrigeration (Peltier) device 401, in order to control the temperature of the respective devices such as the semiconductor laser device. This keeps the oscillating wavelength of the semiconductor laser constant. The numeral 700 is a package, 701 is a substrate, and 702 is a sub-assembly.

The temperature of the etalon 108 should be kept constant too, but the temperature distribution occurs within the package 700 resulting from the conduction, radiation and convection of heat, when the ambient temperature of the package 700 changes. It is found that the temperature of the etalon changes according to the location where it is disposed. For instance, the etalon being disposed in the substrate, it is found that the temperature of the etalon in the vicinity of the location where it is disposed differs from that away from the same location. In other words, it is discovered that there is difference in the temperature of the etalon between the vicinity of the site where the etalon is disposed and a higher location than that. Thus, the temperature of the respective locations within the etalon through which light beam passes changes according to the change of the ambient temperature. On the other hand, the etalon has its own temperature characteristics, so that its transmitted wavelength changes according to the following formula. Thus, the fluctuation of the transmission peak to the temperature change is estimated as follows. That is, the following equation is obtained from the basic formula of the etalon when the angle of incidence is vertical.

$$2nt=m\lambda \tag{12}$$

Supposing that the optical path length change due to the rise of the temperature $\overset{..}{A}T$ is defined as $\overset{..}{a}$ and the transmission peak is obtained at the wavelength of $\lambda+\Delta\lambda$, the following equation is obtained.

$$2(nt+\delta)=m(\lambda+\Delta\lambda) \tag{13}$$

On the other hand, as for $\delta$, assuming that the coefficient of linear expansion $\alpha$ is equal to dt/dT, and the whole differentiation of the optical path length nt being carried out, the following equation is obtained.

$$\delta=((dt/dT)t+n(dt/dT)\Delta T=((dn/dT)+n(dt/dT)t\Delta T \tag{14}$$

From the above equations (12), (13) and (14), the following formula is obtained.

$$\Delta\lambda=(\lambda/n)\ ((dn/dT)+n(dn/dT))\Delta T \tag{15}$$

That is, the temperature coefficient of the transmitted wavelengths does not rely upon the thickness of the etalon, and providing that the temperature coefficient of the refractive factor is defined as [1] and the multiplication of the coefficient of linear expansion and the refractive factor is defined as [2], the temperature coefficient is represented with the sum of [1] and [2]. The linearly approximated formula in reference to n=1.444687 (at the wavelength of 1500 nm) and n=1.443492 (at the wavelength of 1600 nm) to find the refractive factor of the synthetic quartz commonly used as the material for the etalon is represented by the following formula (16).

$$n=1.462612-0.01195\lambda \tag{16}$$

The operating wavelength at 1550 nm being assigned therein, it results in the refractive factor n=1.444. The temperature coefficient of the refractive factor is $8.5\times10^{-2}$. Accordingly, the temperature coefficient of the etalon is found by the following formula.

$$\Delta\lambda=0.009\Delta T\ nm \tag{17}$$

Figure 6:
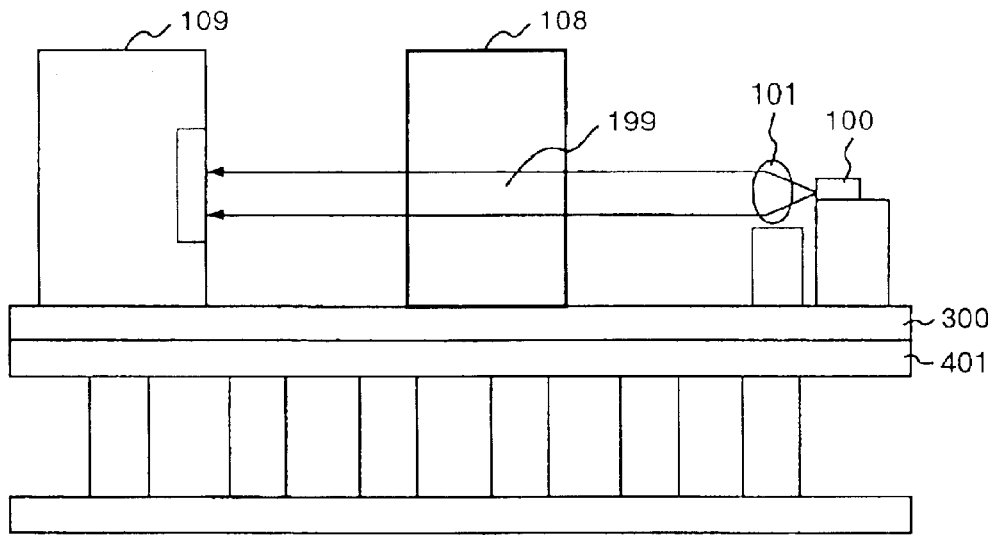
FIG. 6 is an example of the optical system of the conventional wavelength locking arrangement.
Figure 7:
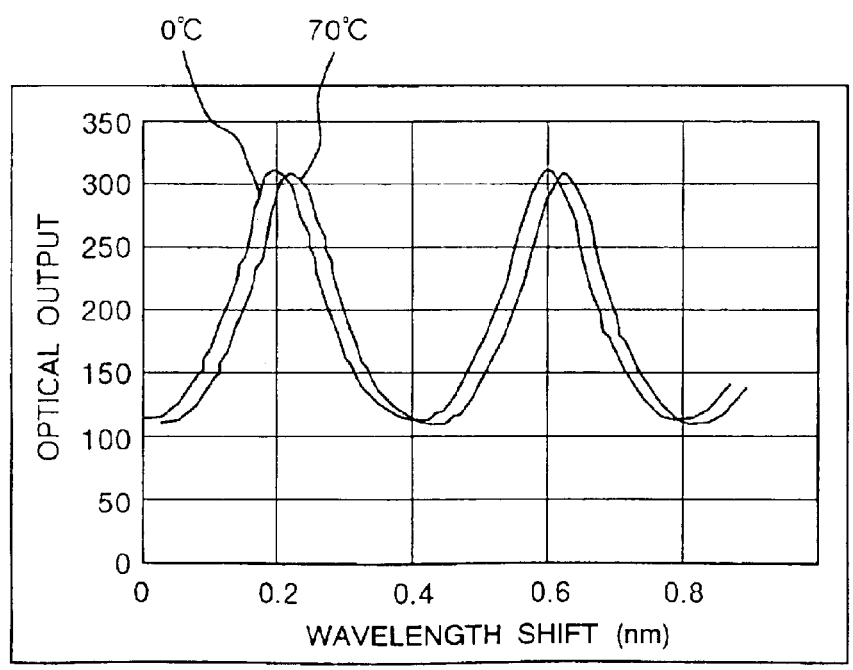
FIG. 7 is view to show the transmission characteristics of the optical system of the prior arrangement displaced owing to the change of the ambient temperature.
Figure 8:
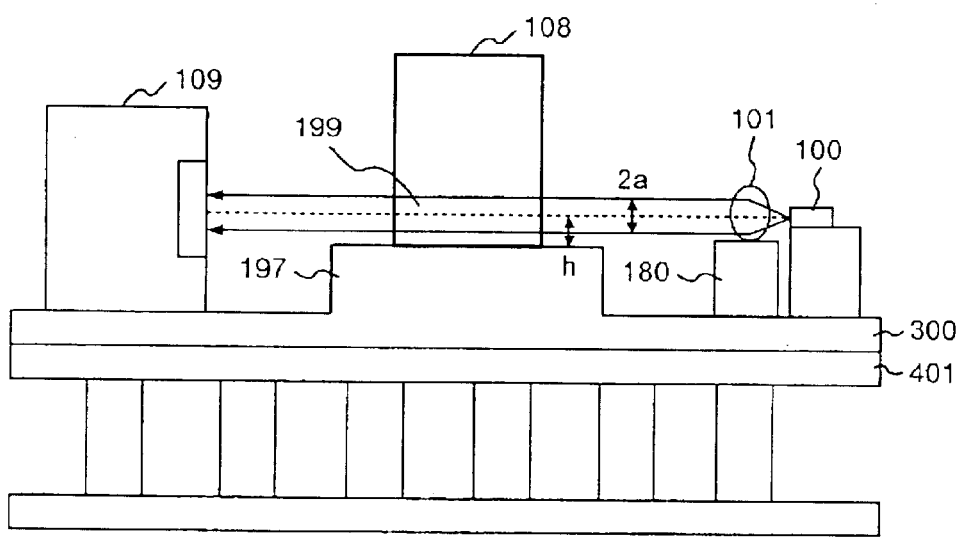
FIG. 8 shows an example of the wavelength locking optical system according to the present invention.
Figure 18:
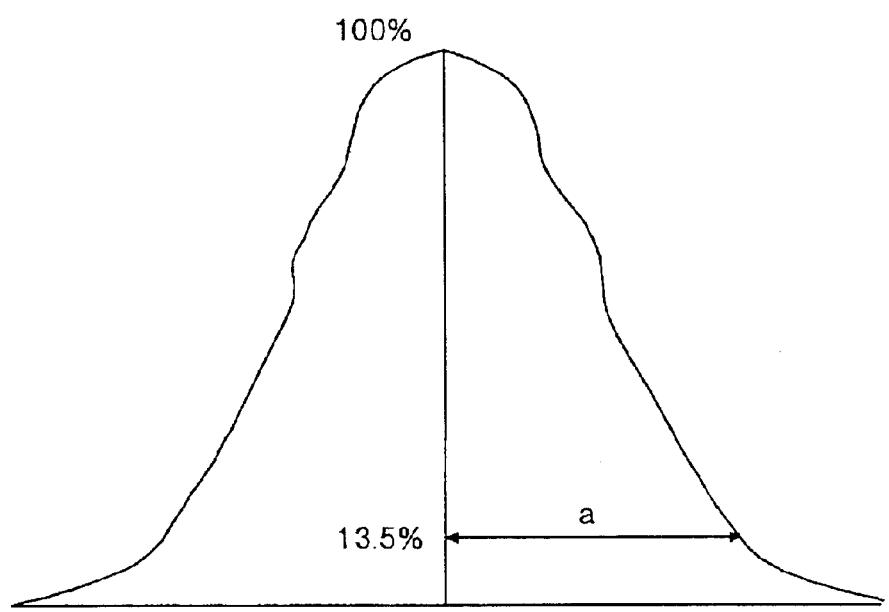
FIG. 18 is an explanatory view to show a beam radius a when the intensity distribution 198 of the converged beams of the semiconductor laser 100 is approximated to the Gaussian distribution.

FIG. 6 shows one example of the conventional wavelength locking optical system, in which the inside of the package is shown as a side view thereof. The light-beam emitted backwards from the laser luminous source 100 is collimated by the collimator lens 101 so as to reach the etalon 108. The transmitted light-beams are received at the light detector 109. Those parts are carried on the stem 300, and contact electronic cooler (Peltier) 401. When the peripheral temperature of the package has changed from 0 centigrade to 70 centigrade, for example, the range of which temperature is standardized as the ambient temperature of the optical communication module, the temperature of a site 199 where the light-beam inside the etalon passes is found by simulation. It results in 27.2 centigrade when the former temperature is at 70 centigrade while resulting in 23.76 centigrade when the former being at 0 centigrade, so that the discrepancy by 3.44 centigrade between the former and latter temperatures occurs. If this discrepancy being converted into the deviation of the transmitted wavelength of the etalon according to the above formula (17), it results in 30.9 pm. This value corresponds to 7.7% of 400 pm that is the grid spacing, so that it undervalues such high wavelength locking precision as required. FIG. 7 shows the deviation of the transmitted wavelength owing to the peripheral temperature change. This deviation is to be solved by the present invention. The first embodiment of the present invention is shown in FIG. 8. That is, a protrusive portion 197 is provided in the substrate 300 that contacts the electronic refrigeration device 401, the upper portion of which protrusive portion is disposed as near as possible to a portion 199 of the wavelength selection device 108 (e.g., etalon), through which portion the transmitted light-beams pass. This enables the change of the wavelength locking characteristics of the optical module owing to the temperature change of the selective filter element to be restrained. That is, as shown in FIG. 18, when the light-beam radius a obtained by approximating the distribution 198 of the converged light-beams intensity of the semiconductor laser 100 by the Gaussian distribution being defined as that which is reduced by $1/e^2$ of the beam intensity peak value e or reduces the beam intensity to approximately 13.5%, the height h from the central axis of the converged light-beams 198 to the lower end portion of the etalon is fixed within the range of either a/10<h<4a or a/20<h<2a. On the installation table 180, a concave or V-shaped groove is notched for positioning the lens 101. As a numeral example of the values a and h, provided that the light-beams of the semiconductor laser luminous source 100 are collimated by a collimator lens with the focal length of 0.5 mm or 1.0 mm and the numerical aperture of 0.15 or 0.6, the light-beams radius a approximately ranges from 75 micron to 600 micron. Therefore, the range of the value h becomes approximately more than 3 micron and less than 4 mm.

Figure 9:
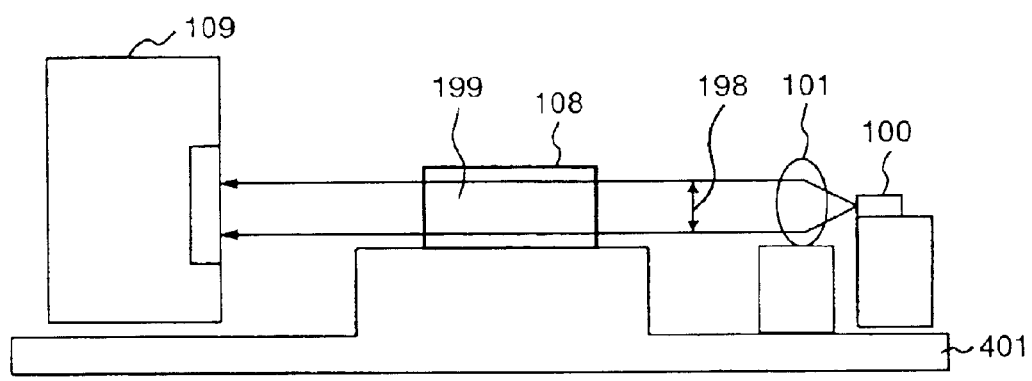
FIG. 9 shows an example of the wavelength locking optical system according to the present invention.

The second embodiment of the present invention is shown in FIG. 9. It is arranged such that the height of the wavelength selection device 108 is lowered so as to substantially equate the height of the same filter element with the luminous flux radius of the transmitted light-beams. This structure enlarges the distance from the upper lid of the package to the upper portion of the filter element, so that the influence brought by the peripheral temperature change of the overall package is minimized.

Figure 10:
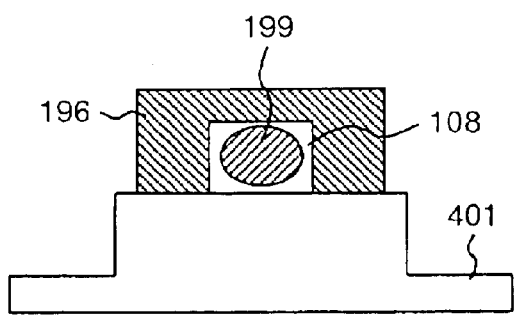
FIG. 10 shows an example of the wavelength locking optical system according to the present invention.

The third embodiment of the present invention is shown in FIG. 10. The wavelength selection device 108 is covered with a metallic material 196 of high heat conductivity, for instance, so that it is arranged such that the temperature difference between the same element 108 (e.g., etalon) and the substrate 401 in contact therewith is hard to occur. Alternatively, it does not matter whether a window having the same size as the luminous flux radius of the transmitted light-beams 199, the light-beams that pass through the etalon 108 being referred to as 199 in the drawing, is provided at the end surface of the cover 196. It is also arranged such that the luminous flux is introduced into the etalon 108 without being interfered with the cover 196 by removing its end surface from the cover. Such structure as above protects the filter element 108 from heat and the influence brought by the change of the peripheral temperature of the package as a whole is minimized. The fourth embodiment of the present invention is shown in FIGS. 11A and 11B. FIG. 11A shows a plane view of the wavelength locking optical system according to the present invention. FIG. 11B shows a cross sectional view of the wavelength locking optical system according to the present invention.

That is, the beam splitter 106 as shown in FIG. 1 is not adopted herein as a method for splitting the light-beams emitted from the semiconductor laser 100. Instead, the wavelength selection device 108 is drawn to one side of the plane surface of the protrusive portion 197 so as to pass one part of the light-beams through without passing through the filter element and to reach the light detector 110. The other part of the light-beams is passed through the filter element 108. The wavelength error detection is conducted between the luminous flux to get through the filter element 108 and that not to pass through the same. However, it is desirable to also adopt the above arrangement embodied in the present invention, as the temperature characteristics of the filter element is an issue yet to be solved. That is, a part of the filter element 108 through which light passes is arranged to contact a material of high heat conductivity. Further, a portion of the upper part of the filter element through which light does not pass is removed so as to enlarge the interval from the upper lid of the package, which restrains the temperature rise of the filter element 108.

The fifth embodiment of the present invention is shown in FIG. 12. In this embodiment, the wavelength selection device 108 is covered with a material 196 of high heat conductivity so as not to invite the difference in temperature between the filter element and the substrate 401 in contact with the electronic refrigeration device. Further, a window having the same size as the luminous flux of the transmitted light-beams 199 is provided in the arrangement. This structure protects the filter element from heat and the influence brought by the change of the peripheral temperature of the package as a whole is minimized.

The sixth embodiment of the present invention is shown in FIGS. 13A and 13B. FIG. 13A shows a plane view of the wavelength locking optical system according to the present invention. FIG. 13B shows a cross sectional view of the wavelength locking optical system according to the present invention. In this embodiment, it is arranged such that the difference in the temperature distribution within the etalon is minimized by splitting the collimated light-beams not into horizontal direction, but into vertical direction so as to make the thickness of the etalon thinner and to enlarge the distance from the package lid, which is not shown in the drawing, of the optical module. This enlarges the space above the etalon 108, with the result that the distance between the etalon and the lid positioned above the same becomes larger. In this case, the light detectors 109 and 110 are disposed not on horizontal direction, but adjacently on vertical direction.

Further, the seventh embodiment of the present invention is shown in FIGS. 14A and 14B. FIG. 14A shows a cross sectional view of an example of the wavelength locking optical system according to the present invention. FIG. 14B shows a cross sectional view of another example of the wavelength locking optical system according to the present invention. In this embodiment, it is arranged such that the difference in temperature does not occur between the filter element 108 and the substrate 401 in contact with the former by covering the same filter element with a material of high heat conductivity in the arrangement of splitting the collimated light-beams as shown in FIG. 13. This structure protects the wavelength selection device from heat and the influence brought by the change of the peripheral temperature of the package as a whole is minimized.

The eighth embodiment of the present invention is shown in FIGS. 15A and 15B. FIG. 15A shows a plane view of an example of the wavelength locking optical system according to the present invention. FIG. 15B shows a cross sectional view of an example of the wavelength locking optical system according to the present invention. In this embodiment, the light-beams diverged from the semiconductor laser 100 are converged at the lens 101 so as to form the slightly diverged light-beams 177. The etalon 108 is slightly slantingly disposed, through which etalon the respective light-beams of different optical path length pass so as to reach tow light detectors disposed in juxtaposition side by side. As a result of it, the wavelength spectral characteristics as shown in FIG. 4 appear to some extent displaced right-and-left at those two light detectors, on the basis of the difference in which characteristics between the respective detectors, the wavelength error signal is obtained. Such wavelength error detection optical system as mentioned above is intended to minimize the influence brought by the change of the peripheral temperature of the package as a whole by providing a trapezoid 197 on the substrate 401 in heat contact with the electronic refrigeration device and disposing a part 199 of the wavelength selection device 108 through which part the transmitted light-beams pass as near as possible to the upper end portion of the trapezoid. In this embodiment, it is arranged such that the height of the installed table 180 of the optical system 101 is lower than that of the lower end portion of the wavelength selection device or etalon 108. Further, the height of the filter element 108 is arranged to be low so as to substantially equate the same with the luminous flux radius of the transmitted light-beams. This structure enlarges the distance from the upper lid of the package to the upper part of the filter element and the influence brought by the change of the peripheral temperature of the package is minimized.

The ninth embodiment of the present invention is shown in FIG. 16. In this embodiment, the wavelength selection device 108 is arranged such that it is covered with a material 196 of high heat conductivity so as not to invite the difference in temperature between the filter element and the substrate 401 in contact with the electronic refrigeration device. Further, a window having the same size as the luminous flux radius of the transmitted light-beams 199 is provided in the arrangement. This structure protects the filter element from heat and the influence brought by the change of the peripheral temperature of the package as a whole is minimized. The numeral 402 is a temperature control circuit, 403 is a themister.

Figure 17:
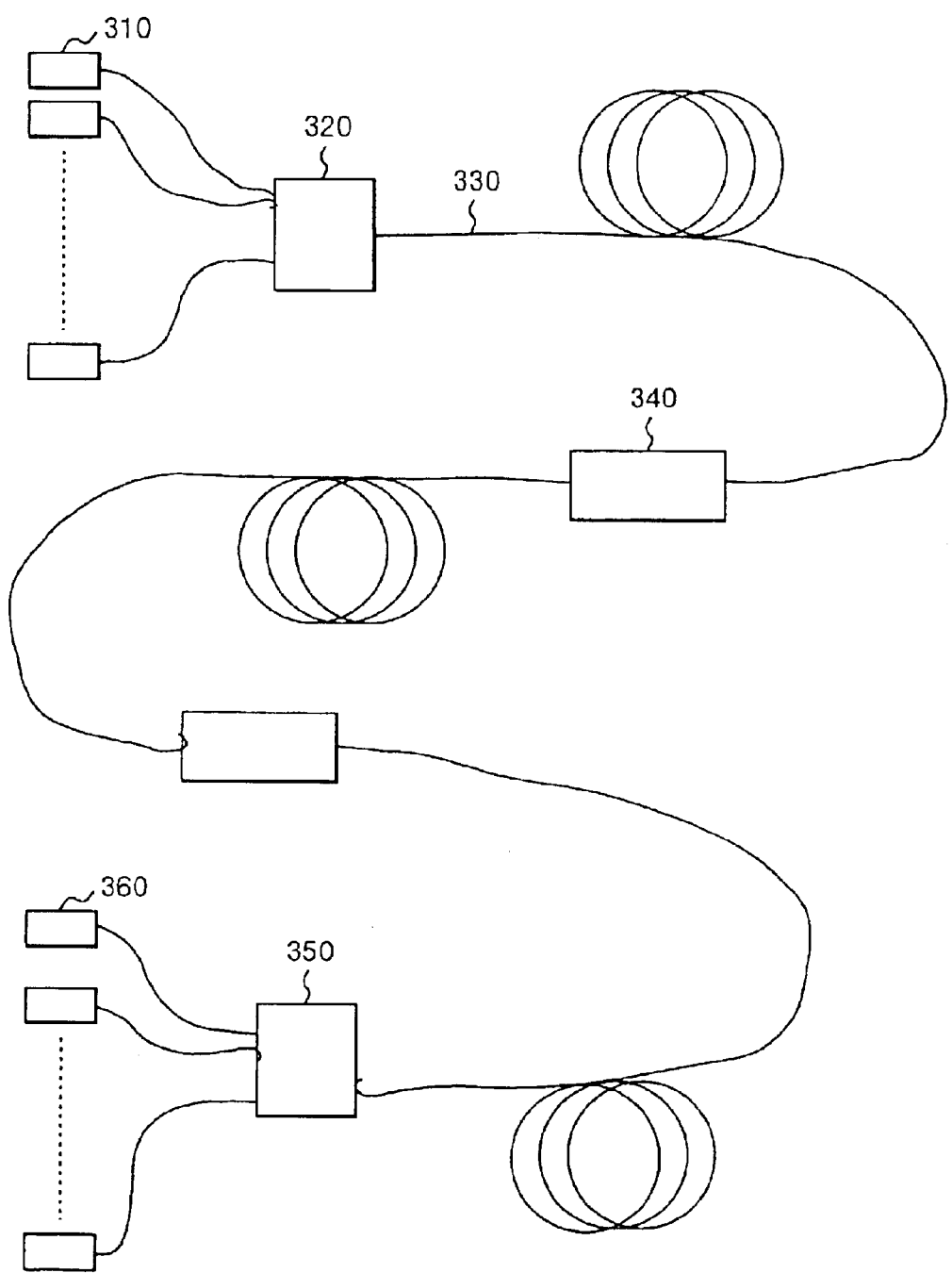
FIG. 17 is a view to show a wavelength multiplexing optical communication apparatus adopting a transmission module incorporating a wavelength locking optical system according to the present invention therein.

The tenth embodiment of the present invention is shown in FIG. 17. In this embodiment, an optical communication module 310 according to the present invention is ready for each channel of the ITU grid wavelength, a number of which modules are disposed in alignment and are connected to a wavelength mupltiplexer 320 so as to multiplex each wavelength into one string of fiber 330. The respective wavelengths as multiplexed with a signal carried thereon are transmitted within the optical fiber over a long distance. Provided that they are propagated by 600 km, for instance, the volume of signals is reduced owing to the propagation loss of the optical fiber. Thus, a repeater 340 comprising an optical fiber amplifier is required. As an example of such amplifier, EDFA (Erbium doped fiber amplifier) prevails over, which amplifies the whole channel signals at a so-called C-band. This band has the wavelength of approximately 32 nm, so that 40 channels are available for the wavelength interval of 0.8 nm while 80 channels are available for that of 0.4 nm. The signals transmitted through several repeaters are branched by a branching filter 350 so as to be converted into an electrical signal by a receiving module 360 arranged for the respective channels. The stable wavelength locking system embodied in the present invention play an important role to remove crosstalk between the channels in such large volume multiplexing communication as above. The numeral 300 is a stem substrat.

As described above, the present invention enables the wavelength locking control loop to be optically and electrically closed in a stable manner so as to utilize the performance of the etalon at best. That is, in view of the filtering capability of the wavelength selectivity, the efficiency of optical utilization, the improvement on the packaging density within the laser luminous source module, mechanical stability and the correction of the displacement of the locked wavelength owing to the temperature change and so forth, the prior issues yet to haven solved are resolved by the present invention. Moreover, the utilization of the present wavelength control system makes it possible not only to lock the oscillating wavelength of the semiconductor laser, but also to transfer wavelengths to the ITU grid as randomly selected and to lock the same wavelengths, with the result that the laser luminous source that is indispensable to a wavelength multiplexing optical communication device and a routing apparatus for wavelength channels is provided.

The present invention enables the displacement from the targeted range for wavelength locking that results from the temperature characteristics of the wavelength error detection device in the wavelength locking optical system to be minimized.

What is claimed is:

1. An optical module, comprising:

substrate;

a semiconductor laser;

a beam splitter which divided a light emitted from said semiconductor laser into a transmitted light and a reflected light;

an etalon through which the transmitted light from said beam splitter is transmitted, at least said semiconductor laser and said etalon being disposed on and in contact with said substrate;

a first optical detection means which receive the light transmitted through said etalon, a second optical detection means which receive the reflected light from said beam splitter;

a temperature control means for controlling a temperature of said etalon and said semiconductor laser, respectively within a predetermined range by way of said substrate;

a circuit for obtaining a difference between a photoelectric current of said first optical detection means and a photoelectric current of said second optical detection means; and a switch which switches the circuit from a temperature control loop to a wavelength control loop after setting an operating temperature of said semiconductor laser, wherein said temperature control means controls the temperature of said etalon and said semiconductor laser so that the difference between a photoelectric current of said first optical detection means and a photoelectric current of said second optical detection means becomes zero or constant, when said switch switches the circuit from the temperature control loop to the wavelength control loop, and wherein the shortest distance h from a fixed end surface of the etalon on the substrate to an optical axis of a light transmitting through said beam splitter and said etalon ranges from one-twenties fold through four fold of said light beam radius a.

2. An optical module according to claim 1, wherein said etalon has a rectangular parallelepiped shape and said transmitted light partially passes over an end surface opposite to the end surface of the etalon provided on and in contact with the substrate.

3. An optical module according to claim 2, wherein said h ranges from one-twentieth through twice of said light's beam radius a.

4. An optical module according to claim 2, wherein said h ranges from 31 µm through 4 mm.

5. An optical module according to claim 2, wherein the shortest distance h ranges from 3 micron through 4 mm.

6. An optical module according to claim 1, wherein said substrate has a protrusive portion, on which portion the etalon is provided, and the said laser luminous source is provided via a plate on the substrate except for said protrusive portion.

7. An optical module according to claim 1, wherein a cover is provided on the substrate such that said cover bridges over the etalon.

8. An optical module according to claim 7, wherein said cover is intended for approaching a temperature of said etalon to that of the substrate, and wherein the cover is brought into contact with both the substrate and the etalon.

9. An optical module according to claim 7, wherein an aperture is provided with said cover so as to enable said transmitted to reach the first optical detection means.

10. An optical module according to claim 1, wherein etalon has a rectangular parallelepiped shape, and said transmitted light partially passes along a surface adjacent to the end surface of the etalon provided on and in contact with the substrate.

11. An optical module according to claim 10, wherein the shortest distance h ranges from 3 micron through 4 mm.

12. An optical module, comprising:
   a substrate;
   a semiconductor laser;
   a beam splitter which divided a light emitted from said semiconductor laser into a transmitted light and a reflected light;
   an etalon through which the transmitted light from said beam splitter is transmitted, at least said semiconductor laser and said etalon being disposed on and in contact with said substrate;
   a first optical detection means which receive the light transmitted through said etalon,
   a second optical detection means which receive the reflected light from said beam splitter;
   a temperature control means for controlling a temperature of said etalon and said semiconductor laser, respectively within a predetermined range by way of said substrate;
   a circuit for obtaining a difference between a photoelectric current of said first optical detection means and a photoelectric current of said second optical detection means; and
   a switch which switches the circuit from a temperature control loop to a wavelength control loop after setting an operating temperature of said semiconductor laser,
   wherein said temperature control means controls the temperature of said etalon and said semiconductor laser so that the difference between a photoelectric current of said first optical detection means and a photoelectric current of said second optical detection means becomes zero or constant when said switch switches the circuit from the temperature control loop to the wavelength control loop, and
   wherein the shortest distance h from a fixed end surface of the etalon on the substrate to an optical axis of a light transmitting through said beam splitter and said etalon ranges from one-tenth fold through two fold said light's beam radius a.

13. An optical module according to claim 12, wherein said transmitted light partially passes through said etalon along a first optical path and partially bypasses said etalon along a second optical path.

14. An optical module according to claim 12, wherein said h ranges from 3 micron through 4 mm.

15. An optical module according to claim 12, wherein the etalon disposed on the substrate has a rectangular parallelepiped shape.

16. An optical module according to claim 12, wherein the etalon disposed on the substrate has a rectangular parallelepiped shape, said h ranges from 3 micron through 4 mm.

17. An optical module according to claim 12, wherein said substrate is provided with a convex portion, on which portion the etalon is provided, and except for the convex portion said laser luminous source is provided on the substrate via a table.

18. An optical module according to claim 12, wherein a cover is provided on the substrate such that said cover bridges over said etalon.

19. An optical module according to claim 18, wherein said cover is intended for approaching a temperature of said etalon to that of the substrate, wherein the cover is brought into contact with both the substrate and the etalon.

20. An optical module according to claim 18, wherein an aperture is provided with said cover so as to enable said transmitted light to reach the first optical detection means.

21. An optical module comprising:
   a substrate;
   a semiconductor laser;
   a beam splitter which divided a light emitted from said semiconductor laser into a transmitted light and a reflected light;
   an etalon through which the transmitted light from said beam splitter is transmitted, at least said semiconductor laser and said etalon being disposed on and in contact with said substrate;
   a first optical detection means which receive the light transmitted through said etalon;
   a second optical detection means which receive the reflected light from said beam splitter; and
   temperature control means provided underneath and in contacting with the substrate,
   wherein the shortest distance from a fixed end of said etalon on said substrate to an optical axis of a light transmitting through said beam splitter and said etalon ranges from one-twenties fold through four fold of said light's radius.

* * * * *